United States Patent
Kim

(10) Patent No.: US 7,220,675 B2
(45) Date of Patent: May 22, 2007

(54) METHOD OF FORMING METAL WIRING OF SEMICONDUCTOR DEVICE

(75) Inventor: Dong Joon Kim, Seoul (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 114 days.

(21) Appl. No.: 11/089,819

(22) Filed: Mar. 25, 2005

(65) Prior Publication Data

US 2005/0221607 A1   Oct. 6, 2005

(51) Int. Cl.
*H01L 21/44* (2006.01)
(52) U.S. Cl. .............. 438/687; 438/637; 438/786; 257/E21.584
(58) Field of Classification Search .......... 438/687, 438/637, 786; 257/E21.584, E21.171
See application file for complete search history.

(56) References Cited

U.S. PATENT DOCUMENTS

| | | | | |
|---|---|---|---|---|
| 5,895,266 A * | 4/1999 | Fu et al. | ...... | 438/648 |
| 6,538,324 B1 * | 3/2003 | Tagami et al. | ...... | 257/751 |
| 6,815,339 B2 * | 11/2004 | Choi | ...... | 438/634 |
| 2002/0029958 A1 * | 3/2002 | Chiang et al. | ...... | 204/192.1 |
| 2004/0168908 A1 * | 9/2004 | Friedemann et al. | ...... | 204/192.17 |
| 2004/0171250 A1 * | 9/2004 | Chiang et al. | ...... | 438/653 |
| 2004/0214430 A1 * | 10/2004 | Ruelke et al. | ...... | 438/687 |
| 2005/0085068 A1 * | 4/2005 | Chiang et al. | ...... | 438/637 |
| 2005/0194691 A1 * | 9/2005 | Sakai et al. | ...... | 257/774 |

FOREIGN PATENT DOCUMENTS

| | | |
|---|---|---|
| KR | 2000-75302 | 12/2000 |
| KR | 2003-823 | 1/2003 |

OTHER PUBLICATIONS

Official action issued in corresponding Korean application No. 2004-21783 dated Apr. 26, 2006.

* cited by examiner

*Primary Examiner*—B. William Baumeister
*Assistant Examiner*—Igwe U. Anya
(74) *Attorney, Agent, or Firm*—Marshall, Gerstein & Borun LLP

(57) ABSTRACT

Disclosed herein is a method of forming a metal wiring of a semiconductor device. A method of forming a metal wiring of a semiconductor device comprises the steps of sequentially forming a first anti-diffusion film, a second interlayer insulating film, a third interlayer insulating film and a capping film on a first interlayer insulating film in which a first metal wiring is formed, patterning the capping film, the third interlayer insulating film, the second interlayer insulating film and the first anti-diffusion film so that the first metal wiring is exposed, thus forming a via hole, patterning the capping film and the third interlayer insulating film so that a given surface of the second interlayer insulating film is exposed on the result in which the via hole is formed, thus forming a metal wiring trench, forming a second anti-diffusion film in the via hole and the metal wiring trench, and sequentially forming copper seed layers in the via hole and the metal wiring trench in which the second anti-diffusion film is formed, and then forming a copper layer by means of an electroplating process, thus forming a via and a metal wiring.

6 Claims, 2 Drawing Sheets

METHOD OF FORMING METAL WIRING OF SEMICONDUCTOR DEVICE

BACKGROUND

1. Field of the Invention

The present invention relates to a method of forming a metal wiring of a semiconductor device, and more specifically, to a method of forming a metal wiring of a semiconductor device, which is formed by a dual damascene process.

2. Discussion of Related Art

Generally, upon formation process of a metal wiring of a semiconductor device, an anti-diffusion film formation process serves to form an anti-diffusion film in a via hole and on a sidewall of a metal wiring trench, thus preventing diffusion of a metal material, which will be formed in a subsequent process.

However, the anti-diffusion film is usually formed by a sputtering process employing high-density metal plasma. In this time, deposited metal ions are deposited on the via hole and the metal wiring trench with straightness. Thus, there is a problem in that the step coverage of the anti-diffusion film is degraded as a design rule of a device reduces.

SUMMARY OF THE INVENTION

Accordingly, the present invention has been made in view of the above problems, and it is an object of the present invention to provide a method of forming a metal wiring of a semiconductor device in which the step coverage of an anti-diffusion film, which is deposited on a via hole and a metal wiring trench, can be improved.

In order to achieve the above object, according to the present invention, there is provided a method of forming a metal wiring of a semiconductor device, comprising the steps of: sequentially forming a first anti-diffusion film, a second interlayer insulating film, a third interlayer insulating film and a capping film on a first interlayer insulating film in which a first metal wiring is formed, patterning the capping film, the third interlayer insulating film, the second interlayer insulating film and the first anti-diffusion film so that the first metal wiring is exposed, thus forming a via hole, patterning the capping film and the third interlayer insulating film so that a given surface of the second interlayer insulating film is exposed on the result in which the via hole is formed, thus forming a metal wiring trench, forming a second anti-diffusion film in the via hole and the metal wiring trench, and sequentially forming copper seed layers in the via hole and the metal wiring trench in which the second anti-diffusion film is formed, and then forming a copper layer by means of an electroplating process, thus forming a via and a metal wiring.

Preferably, the second anti-diffusion film is formed through a three-step process.

The three-step process preferably includes sequentially performing an ionized sputtering process, a high pressure sputtering process and a bias sputtering process.

It is preferred that the ionized sputtering process is performed by applying a low pressure of 3 Torr or less, high power of 5 kW or more, and high magnetic field.

It is preferable that the high pressure sputtering process is performed by applying a high pressure of 3 Torr or more, lower power of 5 kW or less, and no magnetic field.

Preferably, the bias sputtering process is performed under the condition in which a low pressure of 3 Torr or less is applied, RF of about 250 to 500 W is applied to the substrate, and remote plasma in which argon (Ar) ions are supplied is used.

DETAILED DESCRIPTION OF PREFERRED EMBODIMENTS

Figure 1:
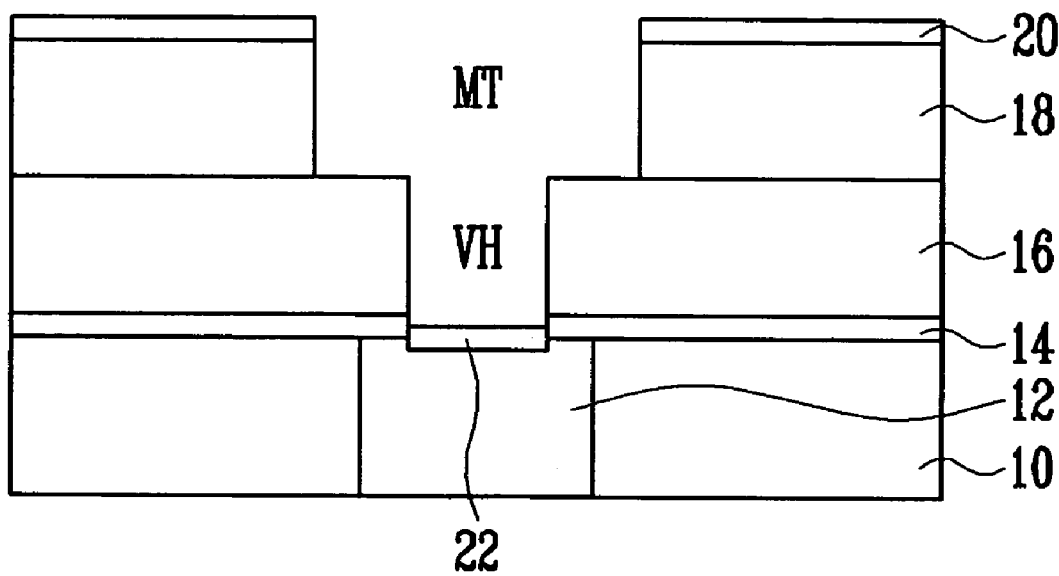
FIGS. 1 to 3 are cross-sectional views for explaining a method of forming a metal wiring of a semiconductor device according to the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, the thickness and size of each layer are exaggerated for explanation's convenience and clarity. Like reference numerals are used to identify the same or similar parts. Meanwhile, in case where it is described that one film is "on" the other film or a semiconductor substrate, the one film may directly contact the other film or the semiconductor substrate. Or, a third film may be intervened between the one film and the other film or the semiconductor substrate.

Figure 2:
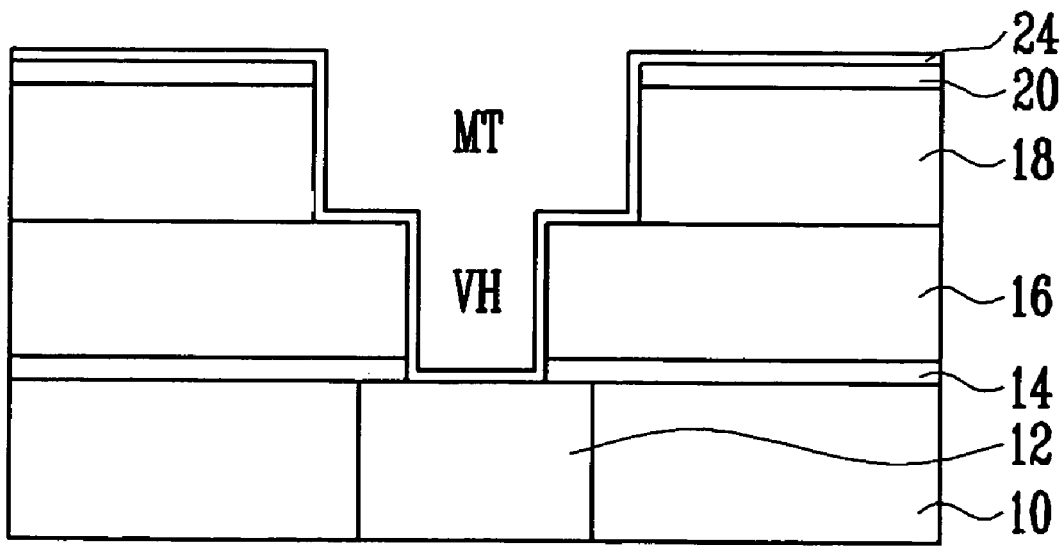
Figure 3:
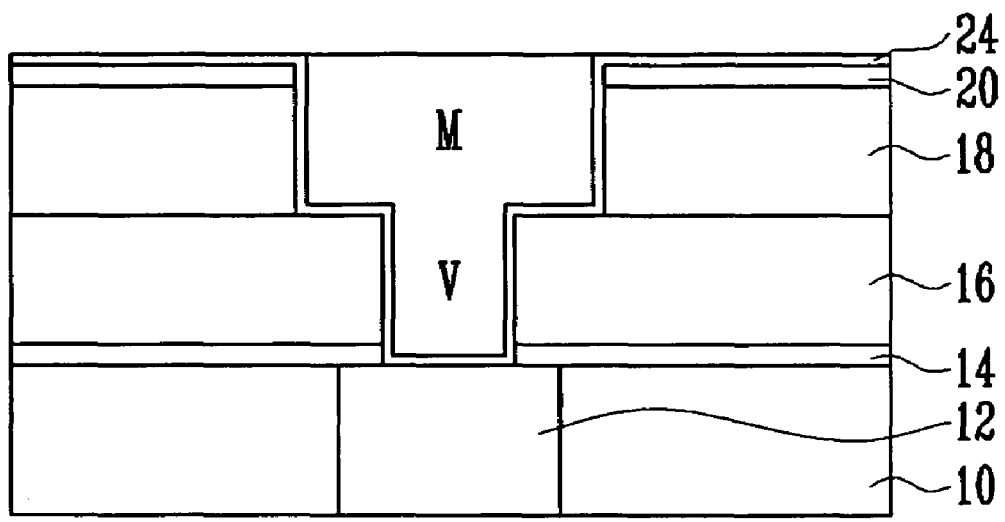

FIGS. 1 to 3 are cross-sectional views for explaining a method of forming a metal wiring of a semiconductor device according to the present invention.

Referring to FIG. 1, a first anti-diffusion film 14, a second interlayer insulating film 16 made of a low dielectric film, a third interlayer insulating film 18 and a capping film 20 are sequentially formed on a first interlayer insulating film 10 in which a first metal wiring 12 formed using a material such as copper is formed.

A first photoresist pattern (not shown) for defining a via hole is formed on the capping film 20. The capping film 20, the third interlayer insulating film 18, the second interlayer insulating film 16 and the first anti-diffusion film 14 are etched using the pattern as an etch mask, thus forming a via hole VH. After the first photoresist pattern (not shown) is stripped, a second photoresist pattern (not shown) for defining a trench pattern is formed. The capping film 20 and the third interlayer insulating film 18 are then etched by using the pattern as an etch mask, thus forming a trench pattern MT. In this time, byproducts, which are generated in the etch process for forming the via hole VH and the trench pattern MT, remain on the first metal wiring 12. Furthermore, as the metal surface reacts in the etch process, a metal oxide film 22 (where, as the first metal wiring is copper, a copper oxide film, i.e., CuO is formed). Since the metal oxide film and the polymeric residues degrade characteristics of the first metal wiring 12 and a second metal wiring, which will be formed through burial of the via hole and the trench pattern, they must be removed. Accordingly, a cleaning process is performed on the entire resulting surface.

The cleaning process is a process of stripping the metal oxide film formed in the exposed via hole or the etch residues generated during the process. It can be performed by using a sputtering etch process or a reactive cleaning process.

Referring to FIG. 2, a second anti-diffusion film 24 is formed on the resulting entire surface from which the metal oxide film 22 and the etch residues are removed, including the via hole and the metal wiring trench.

The second anti-diffusion film 24 can be formed through a three-step sputtering process; an ionized sputtering process, a high pressure sputtering process and a bias sputtering process.

In the ionized sputtering process being the first sputtering process, high power and strong magnetic field are applied to a target so that a metal is ionized, and straightness is then increased with magnetic field, thus forming a second-1 anti-diffusion film. In this time, in the second-1 anti-diffusion film, the top of a metal wiring trench MT and the bottom of a via hole VH are deposited thickly, and the sidewalls of the metal wiring trench and the via hole VH are relatively thinly deposited.

Furthermore, the first sputtering process is performed by applying a low pressure (<3 Torr), high power (>5 kW) and strong magnetic field.

Thereafter, in the high pressure sputtering process being the second sputtering process, a second-2 anti-diffusion film is formed on the second-1 anti-diffusion film by applying low power to a target on which the process will be performed and low magnetic field to a chamber so that a metal is not ionized but has a shape of a nuclear particle, unlike the ionized process of the first sputtering process. In this time, the second-2 anti-diffusion film does not reach the bottom of the via hole, but is usually deposited on a top corner and a sidewall of the metal wiring trench. Accordingly, deposition at the sidewall, which falls short in the first sputtering process, can be secured. In this time, in the second sputtering process, lots of a metal, which is used to deposit the anti-diffusion film, is deposited on the top corner as well as the sidewall of the metal wiring trench.

Moreover, the second sputtering process is performed by applying a high pressure (>3 Torr), low power (<5 kW) and no magnetic field.

Meanwhile, in the bias sputtering process of the third sputtering process, the top corner of the metal wiring trench is much etched than other portion in a second sputtering process by means of a 2D effect. The metal, which is deposited a lot, can be removed in a second sputtering etch process. (Overhang of a pattern can be reduced). Furthermore, the anti-diffusion film at the bottom of the via hole is also removed by way of a self-bias that is generated in a substrate. Accordingly, not only a thickness of the anti-diffusion film at the via bottom can be reduced, but also a step coverage characteristic of the via bottom, which is weak because the anti-diffusion film re-sputtered at the via bottom is deposited on the sidewall of the via bottom, can be compensated for.

Furthermore, the third sputtering process is performed by applying RF of about 250 to 500 W to the substrate at a low pressure (<3 Torr). This process is performed by using remote plasma into which an argon (Ar) ion is supplied.

Referring to FIG. 3, a copper seed layer (not shown) is formed on the resulting entire surface. An electroplating process is then performed to form a copper layer in the via hole VH and the trench pattern MT. A polishing process such as CMP (Chemical Mechanical Polishing) is performed on the resulting surface until the second anti-diffusion film 24 is exposed. Thereby, formation of a via plug V and a metal wiring M is completed.

As described above, according to the present invention, an anti-diffusion film is formed through a three-step sputtering process. Accordingly, a sidewall coverage of the anti-diffusion film can be secured.

Furthermore, according to the present invention, an interfacial phenomenon (reduction in a wetting characteristic of an anti-diffusion film at the interface), which can occur in a sidewall because of a high pressure sputtering process being a second sputtering process, can be improved by means of a high pressure sputtering method. It is thus possible to improve reliability.

Furthermore, according to the present invention, a thickness of an anti-diffusion film at a via bottom can be reduced due to a bias sputtering process being a third sputtering process. Therefore, contact resistance can be reduced.

Furthermore, according to the present invention, if a metal seed layer deposition process as well as an anti-diffusion film process are employed, continuity of a metal seed layer at a via bottom can be improved, and a void phenomenon, which can occur in a subsequent EP process as a design rule of the device rapidly decreases, can be thus reduced. Accordingly, reliability of a device can be improved.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a metal wiring of a semiconductor device, comprising the steps of:

sequentially forming a first anti-diffusion film, a second interlayer insulating film, a third interlayer insulating film and a capping film on a first interlayer insulating film in which a first metal wiring is formed;

patterning the capping film, the third interlayer insulating film, the second interlayer insulating film and the first anti-diffusion film so that the first metal wiring is exposed, thus forming a via hole;

patterning the capping film and the third interlayer insulating film so that a given surface of the second interlayer insulating film is exposed on the result in which the via hole is formed, thus forming a metal wiring trench;

forming a second anti-diffusion film in the via hole and the metal wiring trench by sequentially performing an ionized sputtering process, a high pressure sputtering process and a bias sputtering process; and sequentially forming copper seed layers in the via hole and the metal wiring trench in which the second anti-diffusion film is formed, and then forming a copper layer by means of an electroplating process, thus forming a via and a metal wiring.

2. The method as claimed in claim 1, wherein the ionized sputtering process is performed by applying a low pressure of 3 Torr or less, high power of 5 kW or more, and high magnetic field.

3. The method as claimed in claim 1, wherein the high pressure sputtering process is performed by applying a high pressure of 3 Torr or more, lower power of 5 kW or less, and no magnetic field.

4. The method as claimed in claim 1, wherein the bias sputtering process is performed under the condition in which a low pressure of 3 Torr or less is applied, RF of about 250 W to 500 W is applied to the substrate, and remote plasma in which argon (Ar) ions are supplied is used.

5. The method as claimed in claim 1, wherein the ionized sputtering process includes the steps of:

applying high power and strong magnetic field to a target to ionize a metal;

increasing straightness with the magnetic field; and depositing a second anti-diffusion film on a top of the metal wiring trench and a bottom of the via hole relatively thickly, and on sidewalls of the metal wiring trench and the via hole relatively thinly.

6. The method as claimed in claim 1, wherein the high pressure sputtering process includes the steps of:

applying low power to a target on which the process will be performed and low magnetic field to a chamber; and depositing a second anti-diffusion film on a top corner and a sidewall of the metal wiring trench.

* * * * *